(12) United States Patent
Mani

(10) Patent No.: US 7,649,765 B2
(45) Date of Patent: Jan. 19, 2010

(54) MAGNETIC MEMORY CELL AND METHOD OF FABRICATING SAME

(75) Inventor: Krishnakumar Mani, San Jose, CA (US)

(73) Assignee: Magsil Corporation, Santa Clara, CA (US)

( * ) Notice: Subject to any disclaimer, the term of this patent is extended or adjusted under 35 U.S.C. 154(b) by 0 days.

(21) Appl. No.: 11/964,359

(22) Filed: Dec. 26, 2007

(65) Prior Publication Data

US 2008/0212364 A1 Sep. 4, 2008

Related U.S. Application Data

(63) Continuation of application No. 11/701,322, filed on Jan. 31, 2007, and a continuation of application No. 10/985,472, filed on Nov. 10, 2004.

(60) Provisional application No. 60/876,639, filed on Dec. 22, 2006.

(51) Int. Cl.
*G11C 11/00* (2006.01)

(52) U.S. Cl. .......... 365/158; 365/171; 365/173
(58) Field of Classification Search .......... 365/158, 365/171–173
See application file for complete search history.

(56) References Cited

U.S. PATENT DOCUMENTS

| | | | | |
|---|---|---|---|---|
| 6,963,500 B2 * | 11/2005 | Tsang | .......... | 365/171 |
| 7,173,847 B2 * | 2/2007 | Mani | .......... | 365/158 |
| 7,193,287 B2 * | 3/2007 | Maesaka | .......... | 257/422 |
| 7,394,683 B2 * | 7/2008 | Kumar et al. | .......... | 365/158 |
| 2007/0097734 A1 * | 5/2007 | Min et al. | .......... | 365/158 |

* cited by examiner

*Primary Examiner*—Huan Hoang

(57) ABSTRACT

A magnetic memory cell in which a sensor is magnetically coupled to a magnetic media wherein the separation of the magnetic media from the sensor permits each to be magnetically optimized separate from the other, thus improving defect tolerance and minimizing the magnetic influence of neighboring cells in an array on one another. In an embodiment, the read circuitry is positioned so that no read current passes through the media during a read operation. In an alternative embodiment, processing is simplified but the read current is allowed to pass through the media.

2 Claims, 28 Drawing Sheets

Reading from the Memory cell

Read Current on line 137

Conductor 115 is floating and no voltage applied to this conductor

Read Access transistor 113 is ON

Figure 1 -- SMR Memory cell
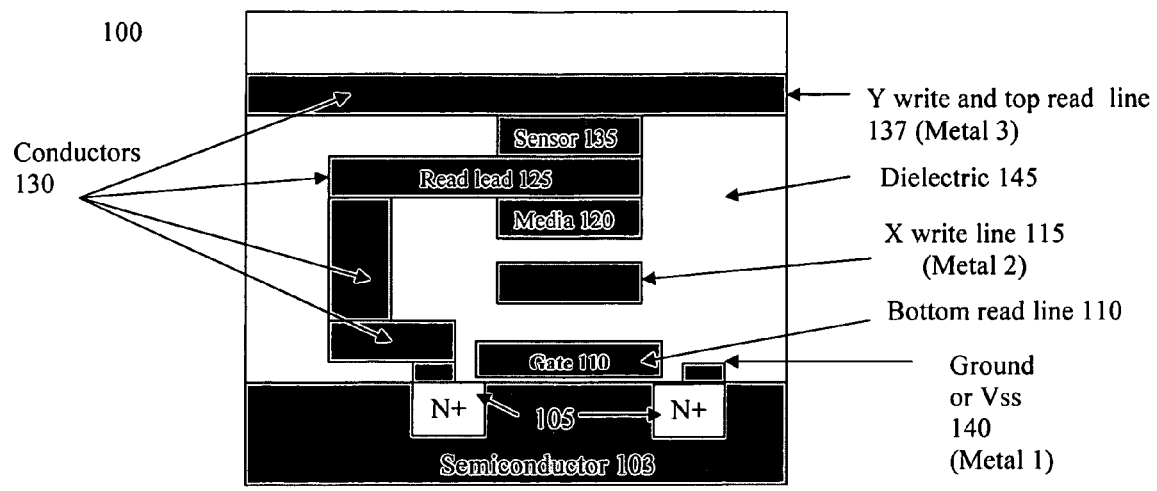
Figure 2 -- Writing into the Memory cell
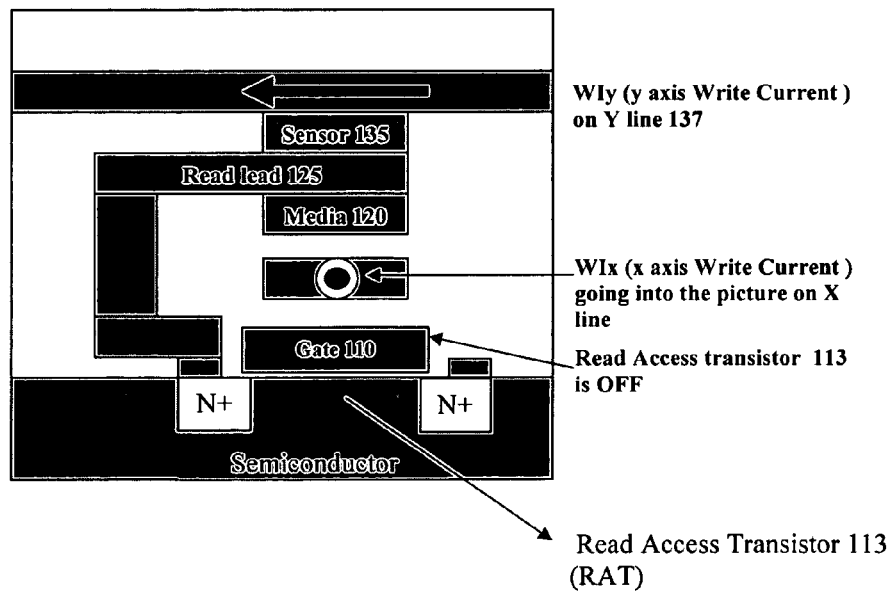

Figure 3 -- Reading from the Memory cell
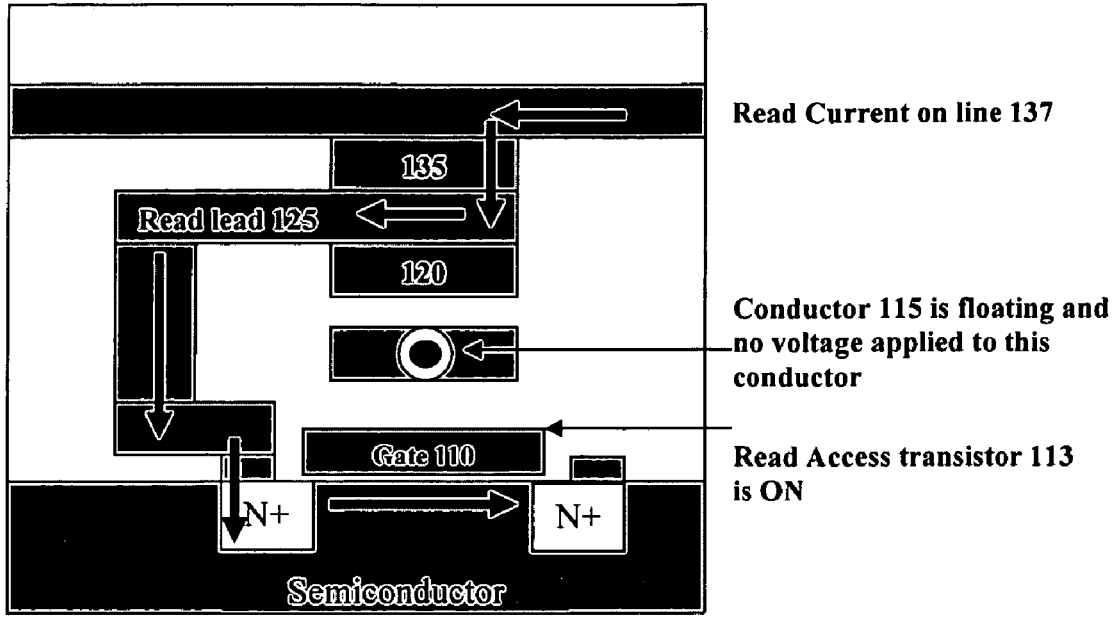
Figure 4 -- Separation of storage media and sensor
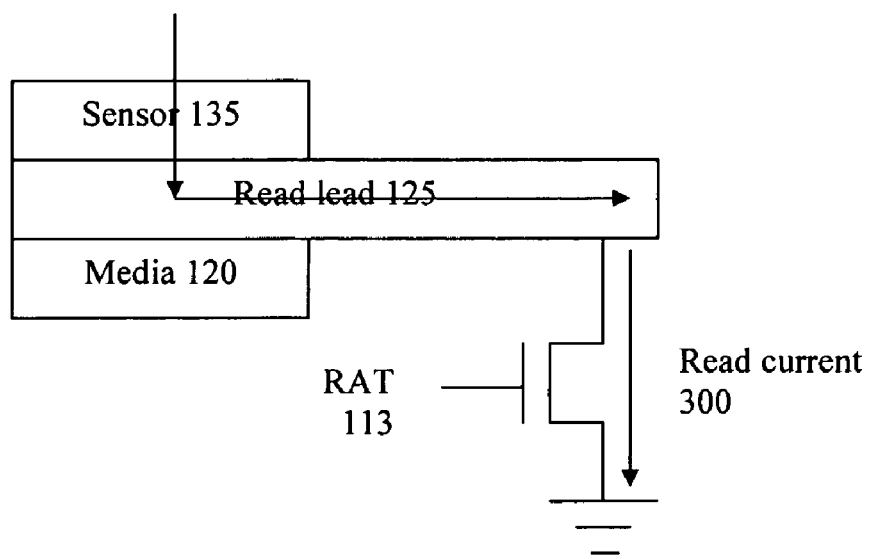

Figure 5 -- Defect Tolerance
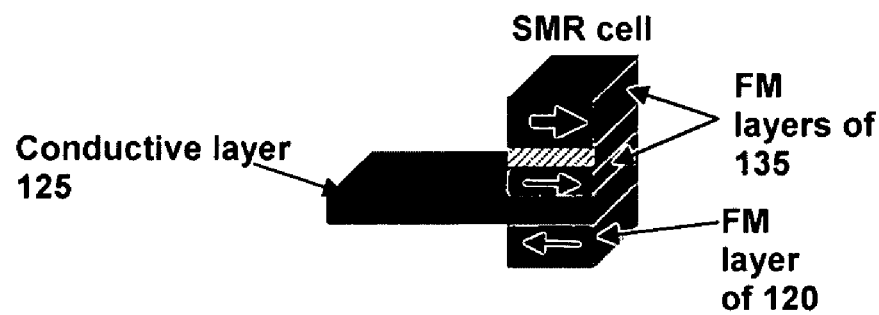
Figure 6 -- Non-Intrusive read
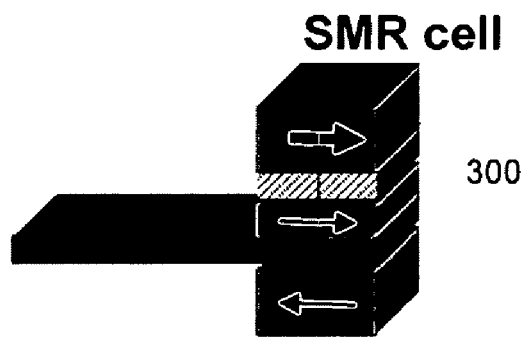

Figure 7 -- Less neighboring bit disturbance due to SMR architecture
Calculation of the magnetic field on a cell due to neighboring cells
Problem definition: Current MRAM structure
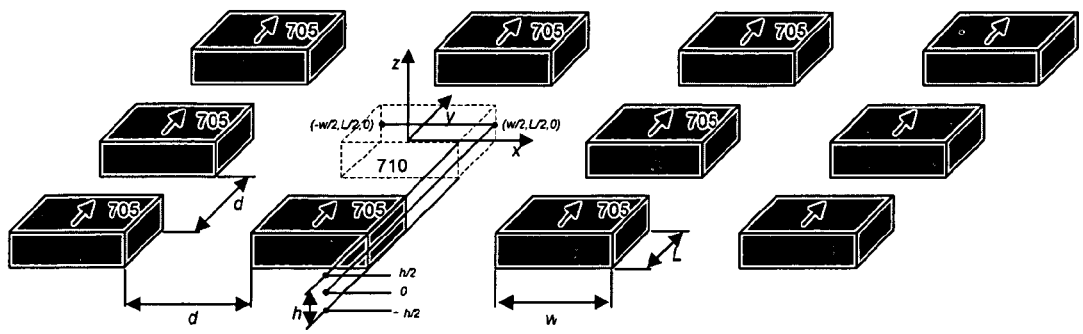
The material of the magnetic pieces is supermalloy (ms=8*10⁵
PRIOR ART

Figure 8
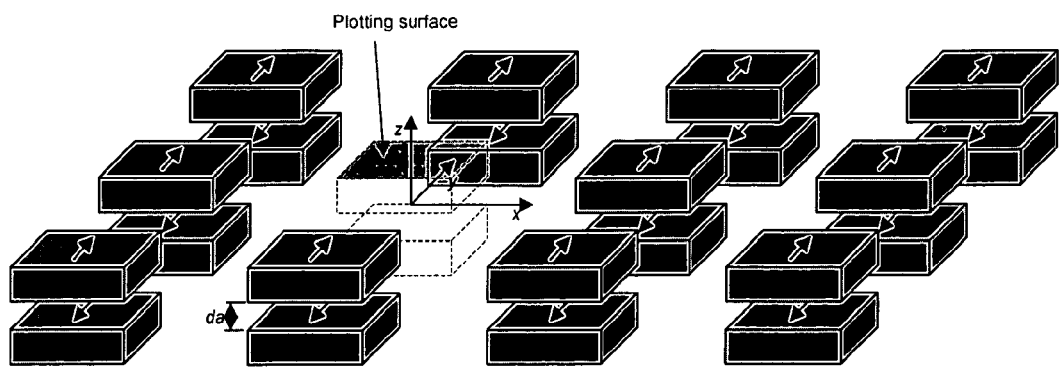
Figure 9A                    Figure 9B
Magnetic field (Oe) of neighboring cells
PRIOR ART
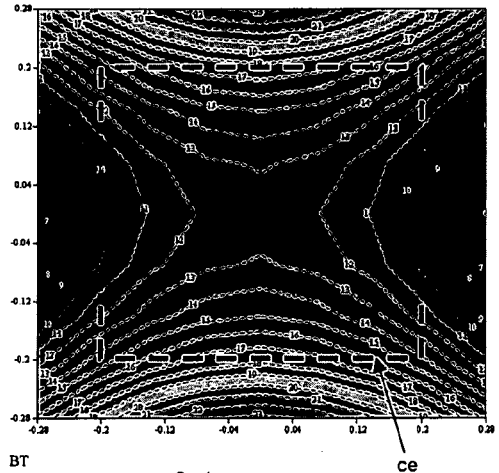
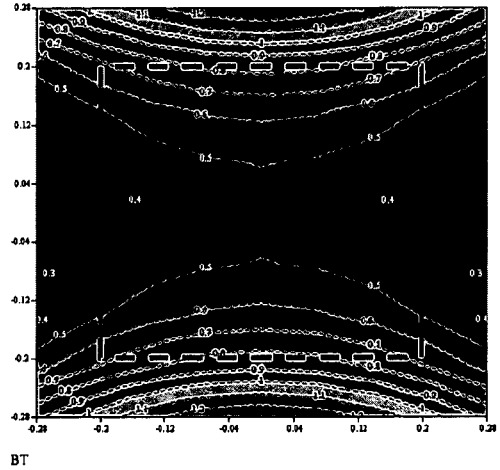
$w=0.4\ \mu m$
$L=0.4\ \mu m$
$h=0.05\ \mu m$
$d=0.7\ \mu m$
$da=0.05\ \mu m$
* All distances given in microns

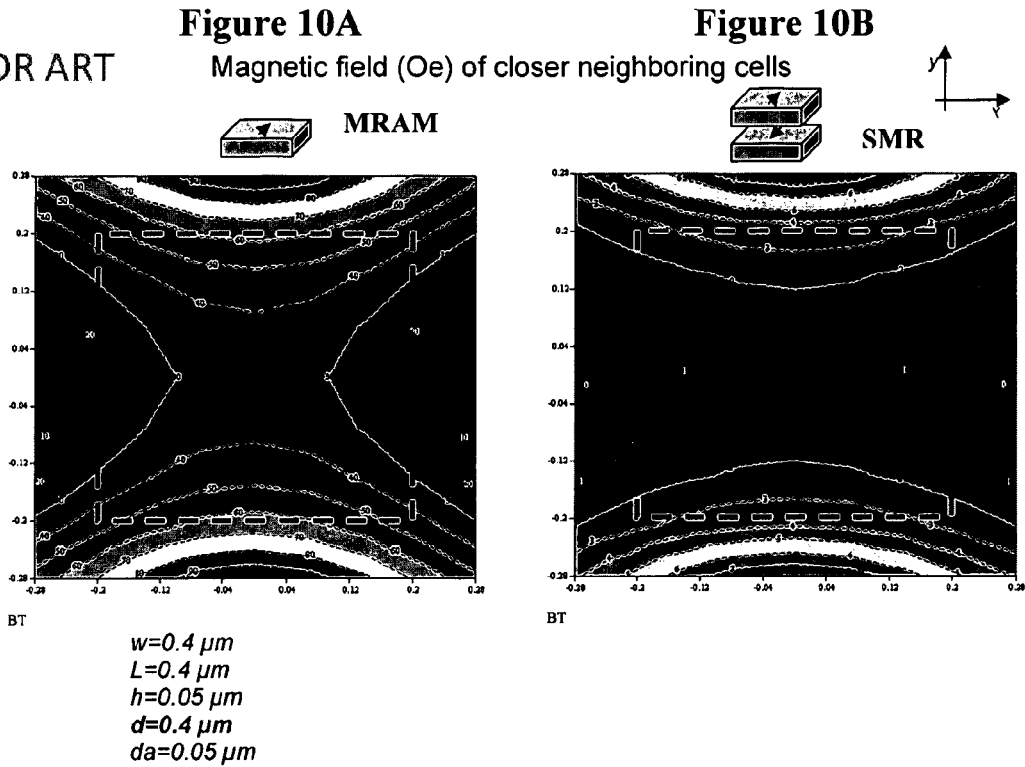
Figure 10A (PRIOR ART) Figure 10B
Magnetic field (Oe) of closer neighboring cells
MRAM
SMR
w=0.4 μm
L=0.4 μm
h=0.05 μm
d=0.4 μm
da=0.05 μm

Figure 11
Switching some cells 90 degrees
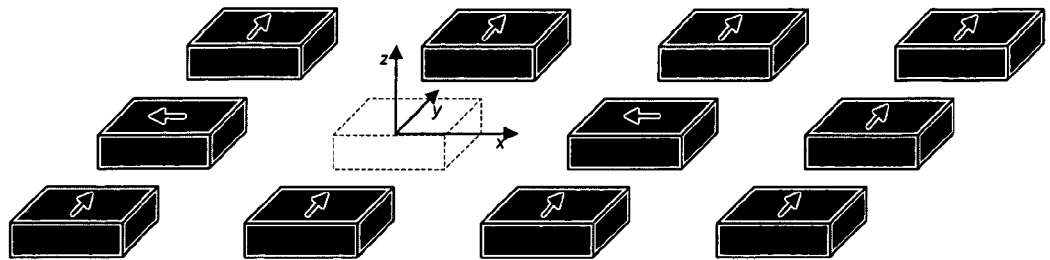
Figure 12A                    Figure 12B
Magnetic field (Oe) - switching some cells 90 degrees
PRIOR ART
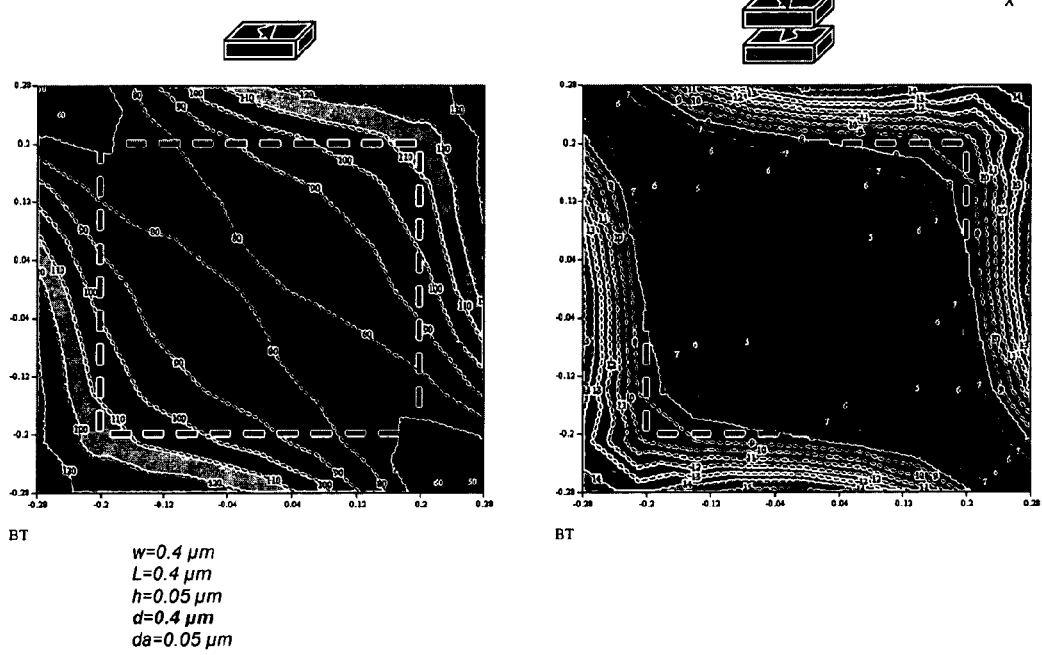
w=0.4 μm
L=0.4 μm
h=0.05 μm
d=0.4 μm
da=0.05 μm

Figure 13
Switching just some cells 180 degrees and keeping the inter-cell distance
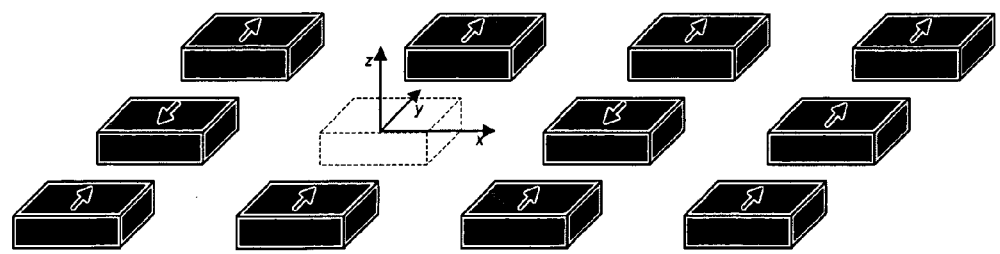
Figure 14A          Figure 14B
Magnetic field (Oe) - switching some cells 180 degrees
PRIOR ART
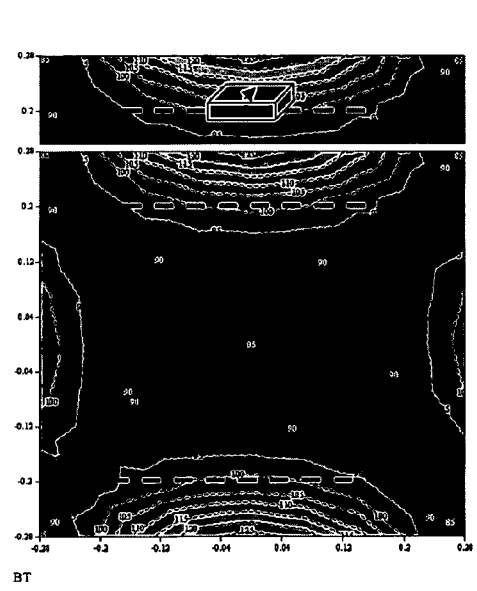 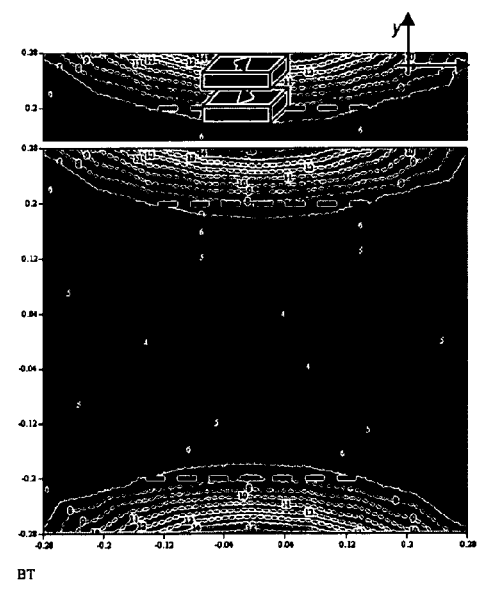
w=0.4 μm
L=0.4 μm
h=0.05 μm
d=0.4 μm
da=0.05 μm

Figure 15 -- Alternate SMR Memory cell
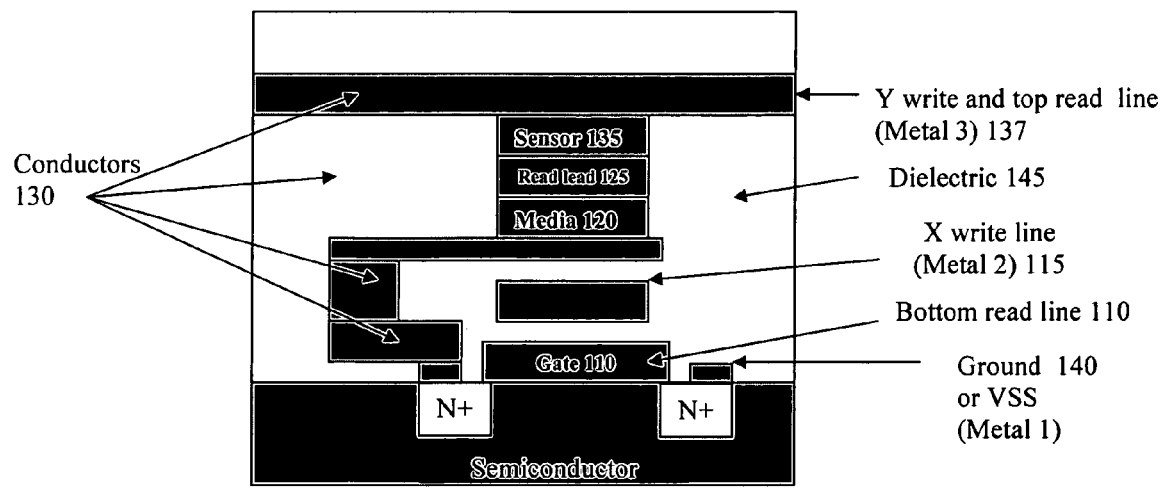

Product cross-section

Oxide deposition

Trench etch Mask 1

Seed Layer deposition

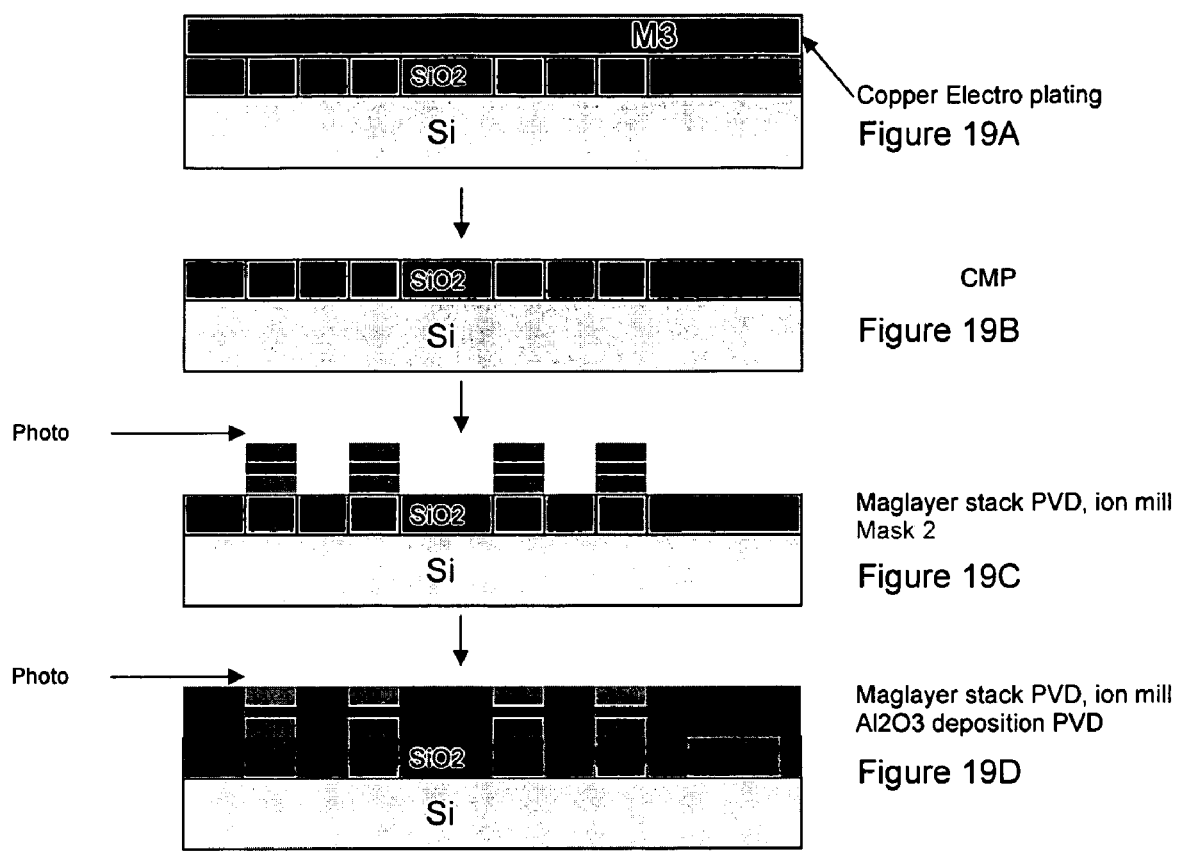

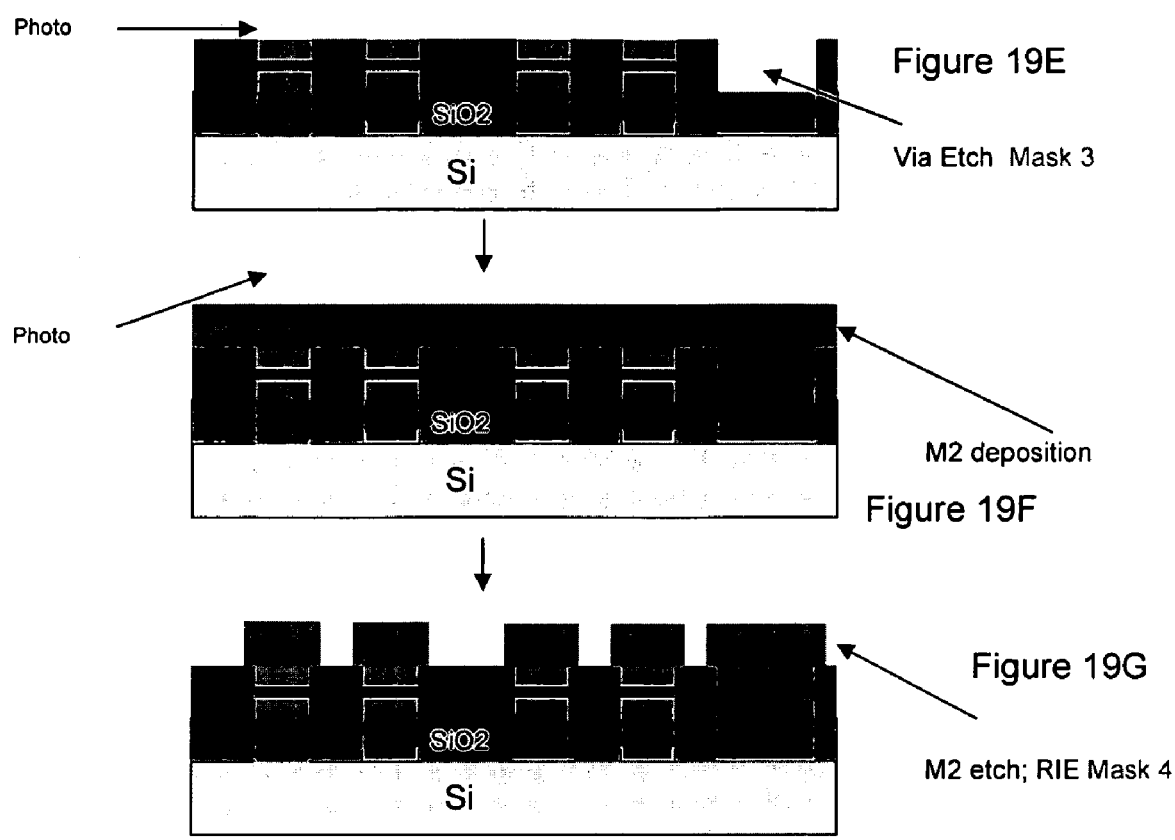

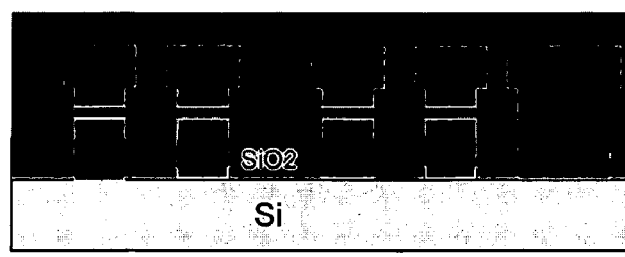
Figure 19E
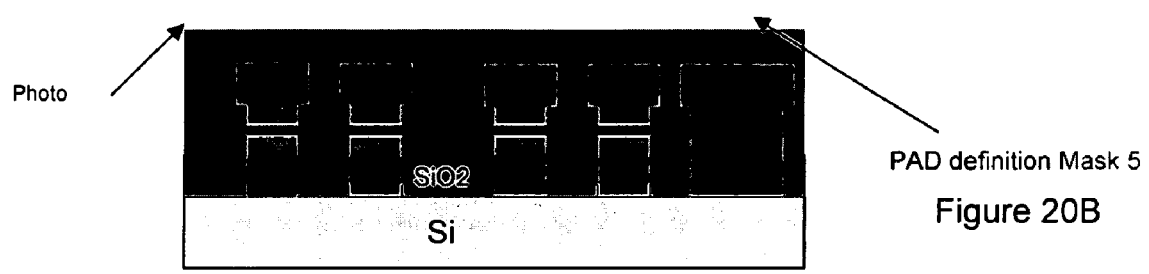
Al2O3 Dep PVD
Figure 20A
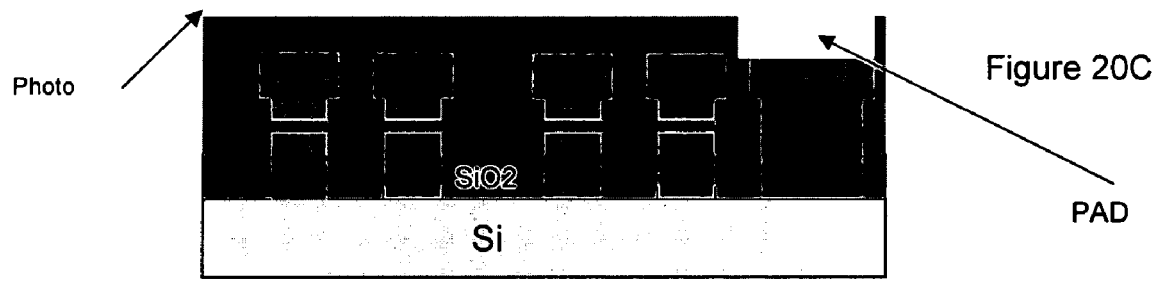
PAD definition Mask 5
Figure 20B
Figure 20C
PAD Figure 22
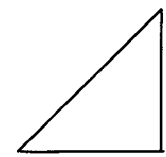
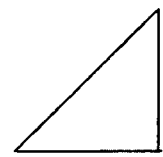
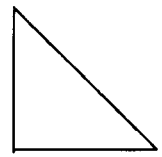
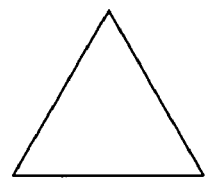
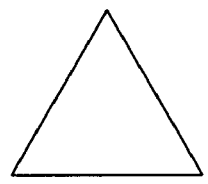
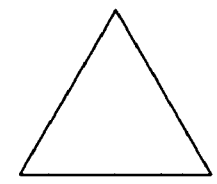
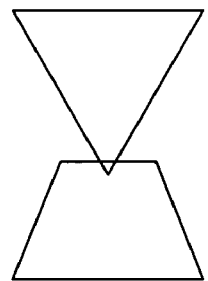
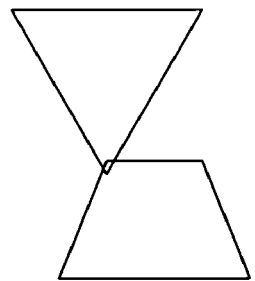
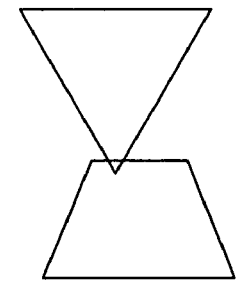
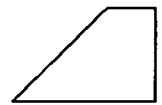
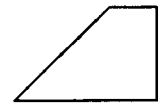
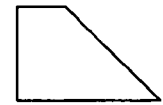

Magnetic field due to 2 current carrying conductors of triangular crosssection

Magnetic field profile from 2 current carrying conductors of rectangular cross section

SMR 4WIRE CELL TOP VIEW

Scale:
 500A X 500A
SMR 4WIRE CROSS SECTION
Figure 29
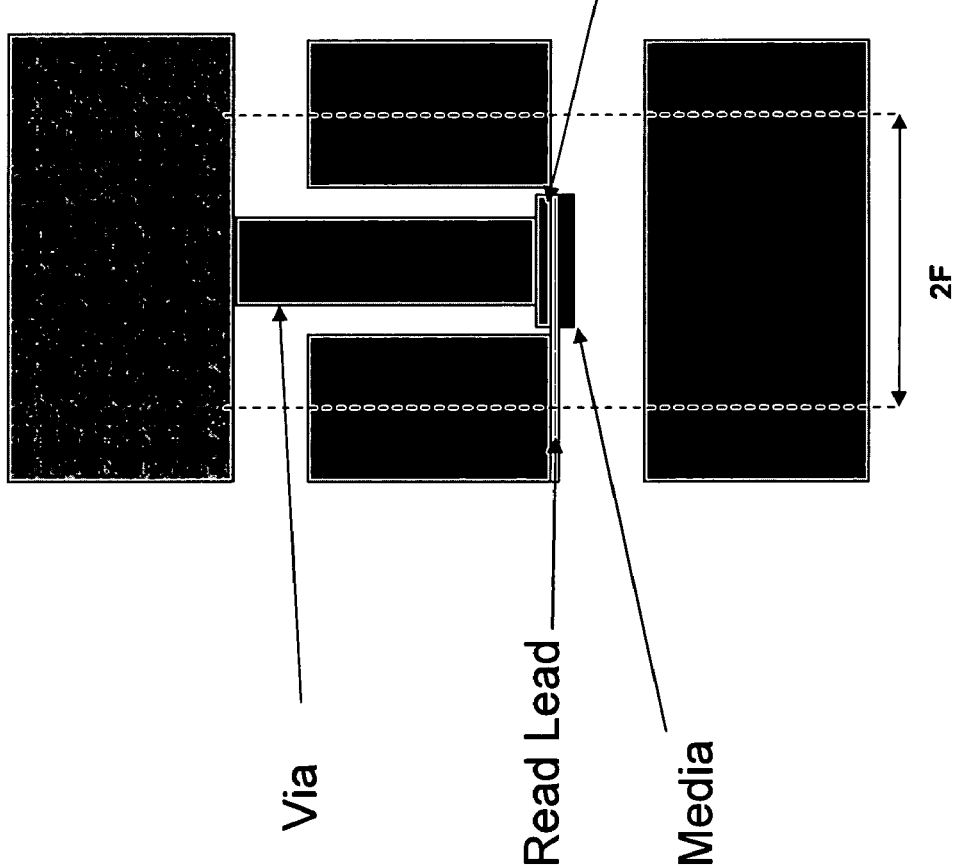

Figure 30 Writing the 3 wire bitcell
CROSS SECTION AND TOP VIEW

Simplified 3 wire bitcell

Array Structure

MAGNETIC MEMORY CELL AND METHOD OF FABRICATING SAME

RELATED APPLICATIONS

This application claims the benefit of U.S. Provisional Patent Application Ser. No. 60/876,639, filed Dec. 22, 2006, and further claims the benefit of U.S. patent application Ser. No. 10/985,472, filed Nov. 10, 2004, as well as U.S. patent application Ser. No. 11/701,322, filed Jan. 31, 2007, all of which are incorporated herein by reference.

FIELD OF THE INVENTION

The present application is directed to solid state memory cells having magnetic media, and, in some aspects of the disclosed inventions, is more particularly related to magnetic media memory cells in which the storage media and the sensor are separated.

BACKGROUND OF THE INVENTION

Within the field of memories, there is continuing interest in finding ways to increase the storage density and speed of memories. As the personal use of small devices gains popularity, the memory of this equipment has to be modified to match the function and design of these devices. Particularly, as more and more data needs to be stored in memory, the memory needs to have the capacity and speed to handle such demand.

The discovery of the phenomena of the magnetoresistive (MR) effect and the giantmagnetoresistive (GMR) effect provided significant advancements in the field of memory technology. These phenomena demonstrated that the resistance of multilayer thin films comprised of ferromagnetic layers sandwiching a conducting layer can change significantly depending on the direction of an external magnetic field.

GMR is observed in magnetic metallic layered structures in which it is possible to orient the magnetic moments of the ferromagnetic layers relative to one another. One such type of magnetic metallic layered structure consists of a stack of four magnetic thin films: a free magnetic layer, a nonmagnetic conducting layer, a magnetic pinned layer and an exchange layer. Magnetic orientation of the pinned layer is fixed and held in place by the exchange layer.

By applying an external magnetic field, the magnetic orientation of the free layer can be changed with respect to the magnetic orientation of the pinned layer. The change in the magnetic orientation generates a significant change in the resistance of the metallic layered structures. The resistance of the structure determines the logical value to be stored therein. Disk drives that are based on GMR technology use it to control a sensor that responds to very small rotations of magnetic orientation of the GMR free layer due to magnetization on the disk. However, the present use of this technology in disk drives requires the disk to rotate and head to position on the track to be read, which typically requires on the order of 10 ms. In contrast, the access time of the GMR technology itself is generally on the order of 3-5 ns. The disk drive therefore is not utilizing the full potential of fast response time of the GMR, which could translate into small access time.

A related phenomena is the Magnetic Tunneling Junction, as discussed in U.S. Pat. Nos. 5,835,314 and 5,629,922, where a trilayer structure of a ferromagnet ("FM")-insulator-FM exhibits increased junction resistance across the trilayer structure when the magnetization of the FM layers is antiparallel to one another as compared to when the magnetization of the FM layers is parallel.

Thus there is a clear need in the industry to develop fast memories which can take advantage of the GMR and MTJ phenomena without requiring the long latency associated with the rotation of a disk drive.

SUMMARY OF THE INVENTION

The present invention provides a magnetic memory cell in which, in some embodiments, an MTJ or GMR structure is implemented wherein no read current passes through the media, and in which the storage media and the sensor are separated but magnetically coupled. Defect tolerance is significantly improved over the prior art by permitting independent optimization of the storage layer, or media layer, and a free layer which comprises part of the sensor together with the exchange layer. In some embodiments of the present invention, the media layer can be two or more times stronger magnetically than the free layer, thus permitting the media layer to switch the free layer reliably and repeatably.

The media is typically either single or multiple layers of ferromagnetic materials, while the sensor, or free layer, can be any CPP/CIP sensor made of multiple magnetic and non-magnetic layers capable of sensing the orientation of the media. The architecture of the present invention also results in less disturbance of adjacent memory cells.

In an alternative embodiment, the read lead mask is eliminated while still maintaining the advantages of the first embodiment, except that read current is permitted to pass through the media in such embodiments.

In another aspect of the invention, the shape of the write lines is configured to optimize the magnetic field caused when a current is passed through the line, to minimize the amount of current needed to switch the magnetization of the storage media, sometimes referred to hereinafter as the media. In particular, triangular shapes of conductors are compared to rectangular conductors. Other shapes are also disclosed.

THE FIGURES

FIG. 1 illustrates in cross-sectional view a first embodiment of a magnetic memory cell configuration in accordance with the present invention.

FIG. 2 illustrates in cross-sectional view the magnetic memory cell structure of FIG. 1, marked to show the current flow through the cell during a Write.

FIG. 3 illustrates the memory cell structure of FIG. 1 during a read function.

FIG. 4 illustrates schematically the separation of the sensor and the media in the present invention, which permits the media, or storage layer, to be optimized separately from the free layer, which is part of the sensor.

FIG. 5 illustrates schematically the FM layers in an embodiment of the invention, such that a manufacturing defect in the free layer is less likely to cause a dead bit, since the media layer can be on the order of two or more times stronger than the free layer, and will thus switch the free layer such that the memory cell is functional and the data is read correctly.

FIG. 6 illustrates that no current passes through the media during a read.

FIG. 7 [PRIOR ART] illustrates, for prior art MRAM structures, the effect of neighboring cells on a memory cell.

FIG. 8 illustrates, for the current invention, the reduced effect of neighboring cells on the state of a cell.

FIGS. 9A and 9B are plots of magnetic field versus distance for a prior art MRAM cell and the present invention, respectively, and show graphically the reduced effect of neighboring cells on the magnetic fields of a cell in accordance with the invention.

FIGS. 10A and 10B are additional plots of magnetic field versus distance for a prior art MRAM cell and the present invention, respectively, at a closer distance between a cell and its neighbors.

FIG. 11 shows a different configuration of cells in which some cells are switched 90 degrees, but the inter-cell distance is the same as for FIGS. 10A and 10B.

FIGS. 12A and 12B show the effect of neighboring cells for a prior art MRAM device and a cell in accordance with the present invention, respectively, and again illustrates the reduced effect of neighboring cells with the current invention.

FIG. 13 shows an array of cells, with the same inter-cell distance as before, where some cells are switched 180 degrees.

FIGS. 14A-14B show, for a prior art MRAM cell and the current invention, respectively, the magnetic fields versus distance, again showing the improved magnetic isolation of the current invention.

FIG. 15 illustrates in cross-sectional view an alternate embodiment of the present invention, in which process complexity is reduced by eliminating the read lead mask. The read and write functions remain the same as for the embodiment of FIG. 1.

Figure 16:
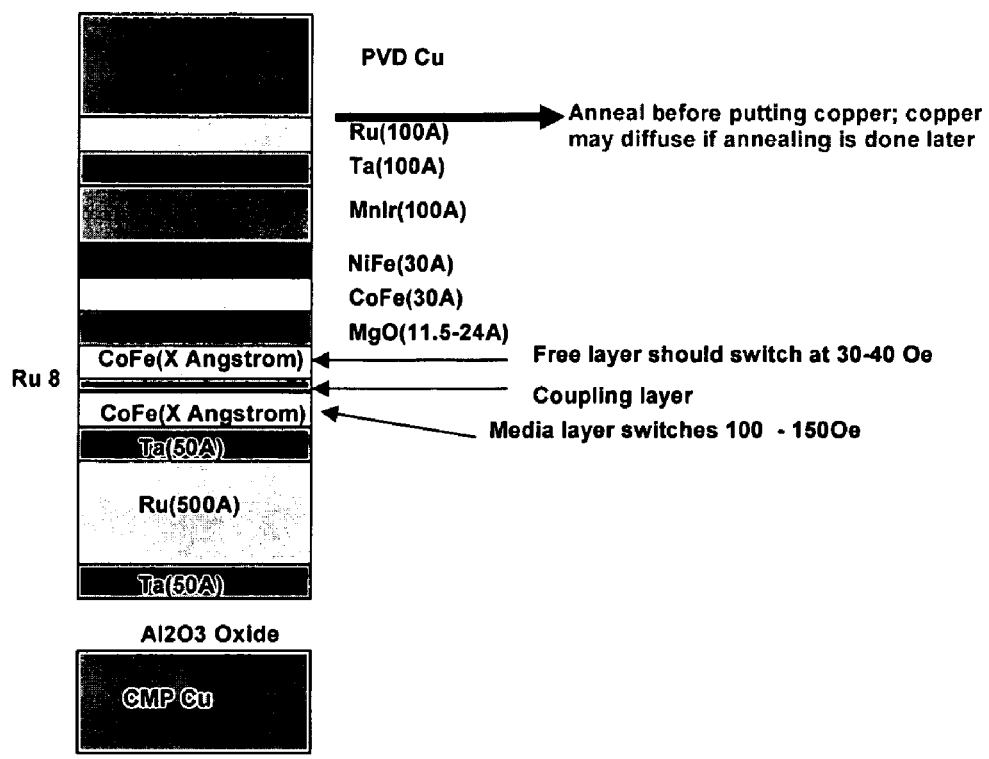

FIG. 16 illustrates, by layer, a cell in accordance with the invention, and shows the materials and thicknesses for each layer of an embodiment in accordance with one aspect of the invention.

Figure 17:
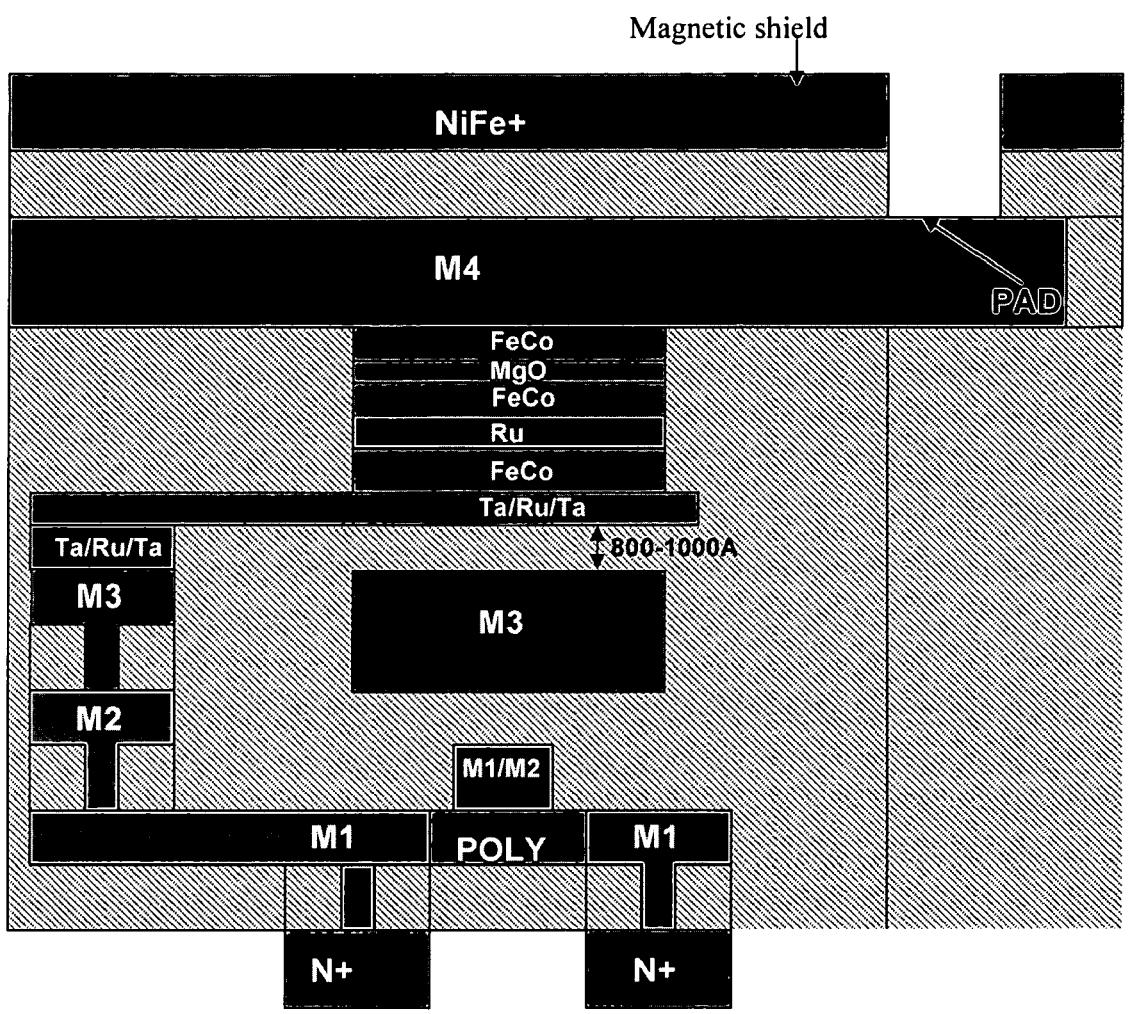
Figures 18A, 18B, 18C, 18D:
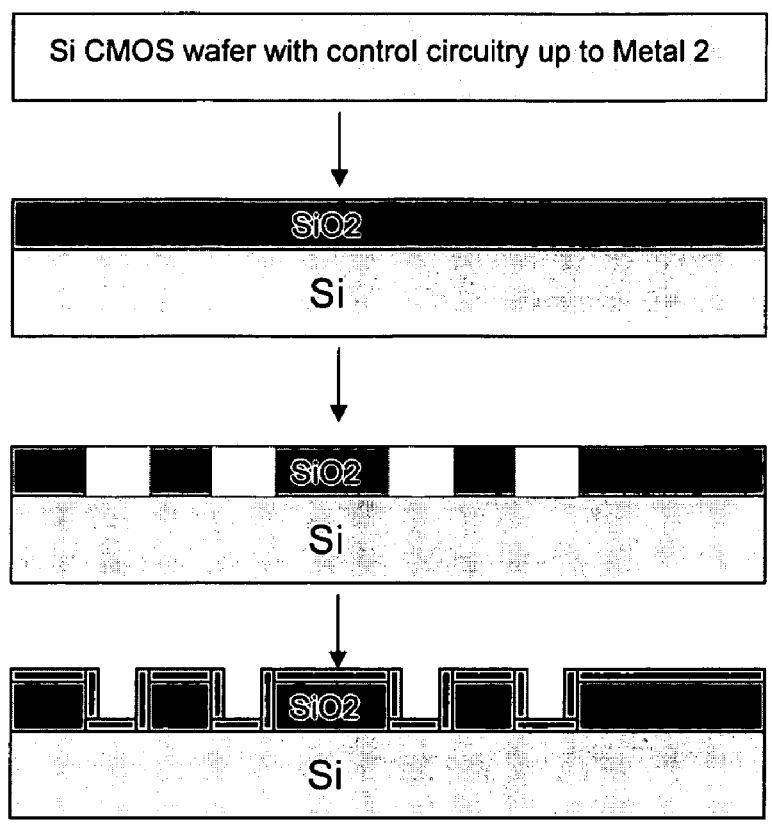

FIG. 17 shows a detailed view of the product cross-section for a cell in accordance with the invention.

FIGS. 18A-20C illustrate generally a fabrication process for a memory cell in accordance with the invention.

Figure 21:
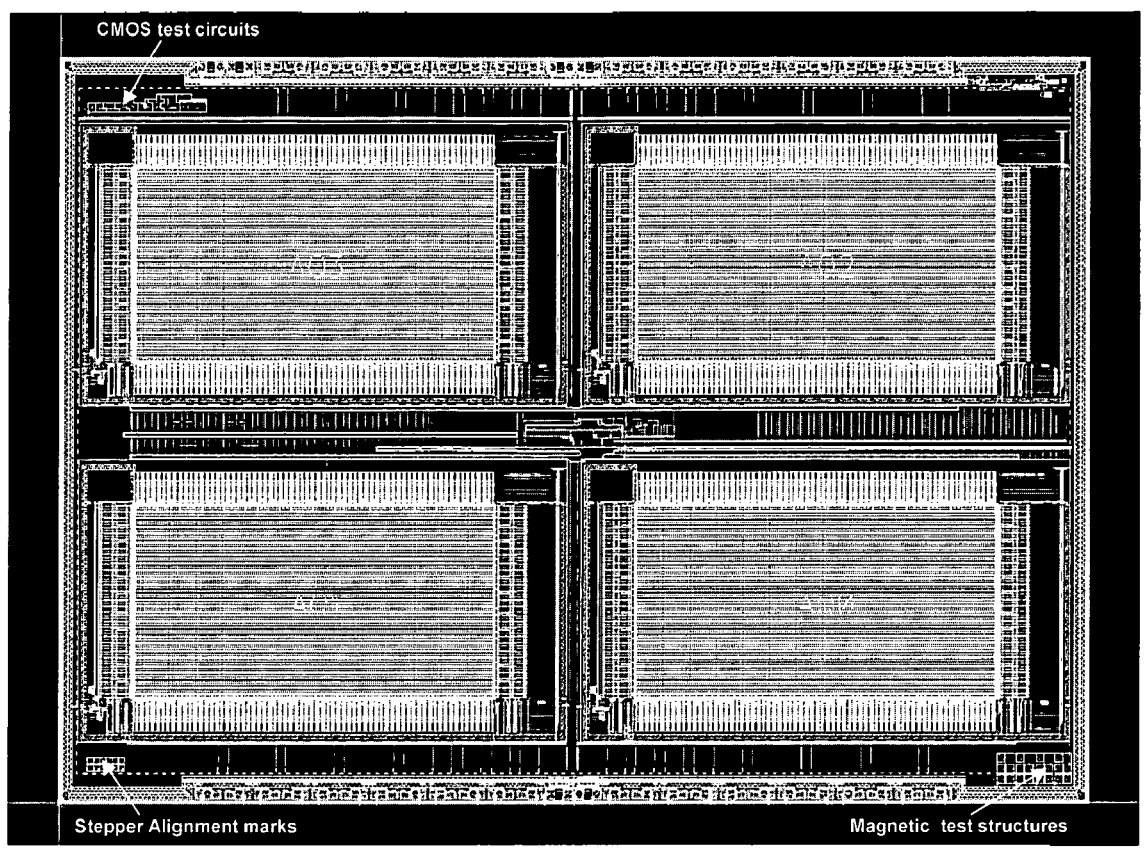

FIG. 21 is a photograph of a 1 Mb random access memory array in accordance with the invention.

FIG. 22 illustrates a different aspect of the invention, and shows a plurality of conductor shapes for shaping and strengthening the fields created by the conductors.

Figure 23:
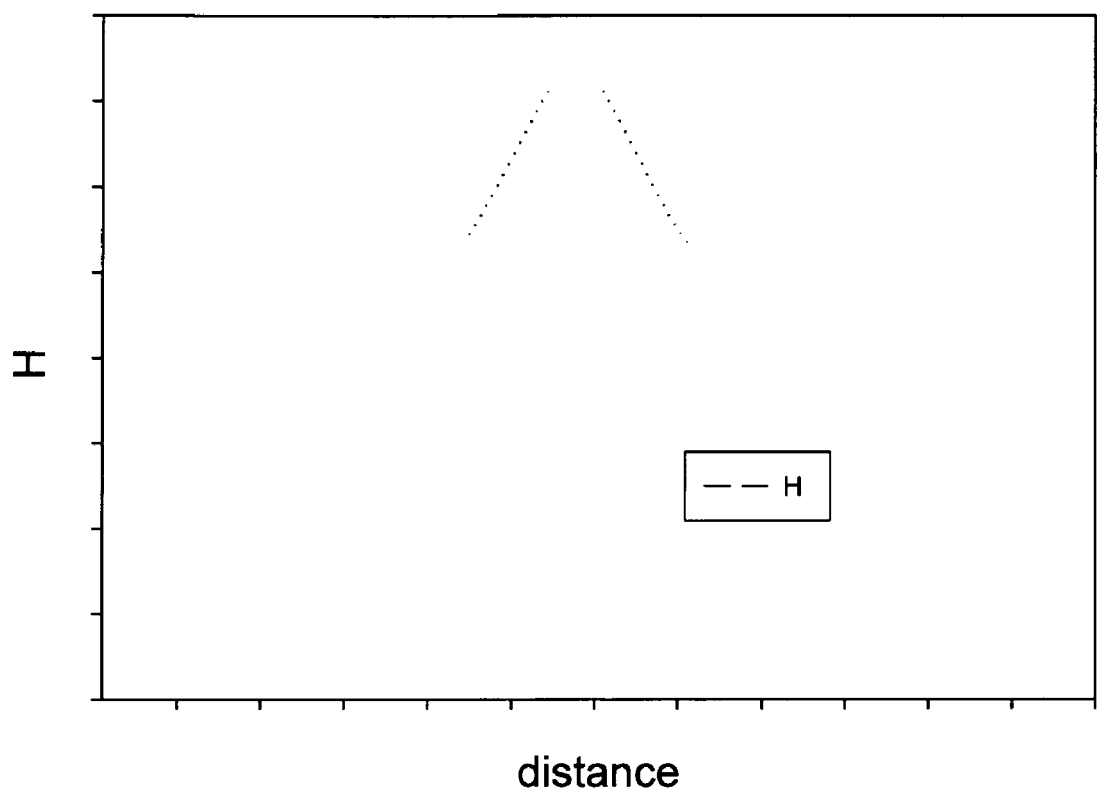

FIG. 23 illustrates the magnetic field resulting from one triangular shaped current carrying conductor as shown in FIG. 22.

Figure 24:
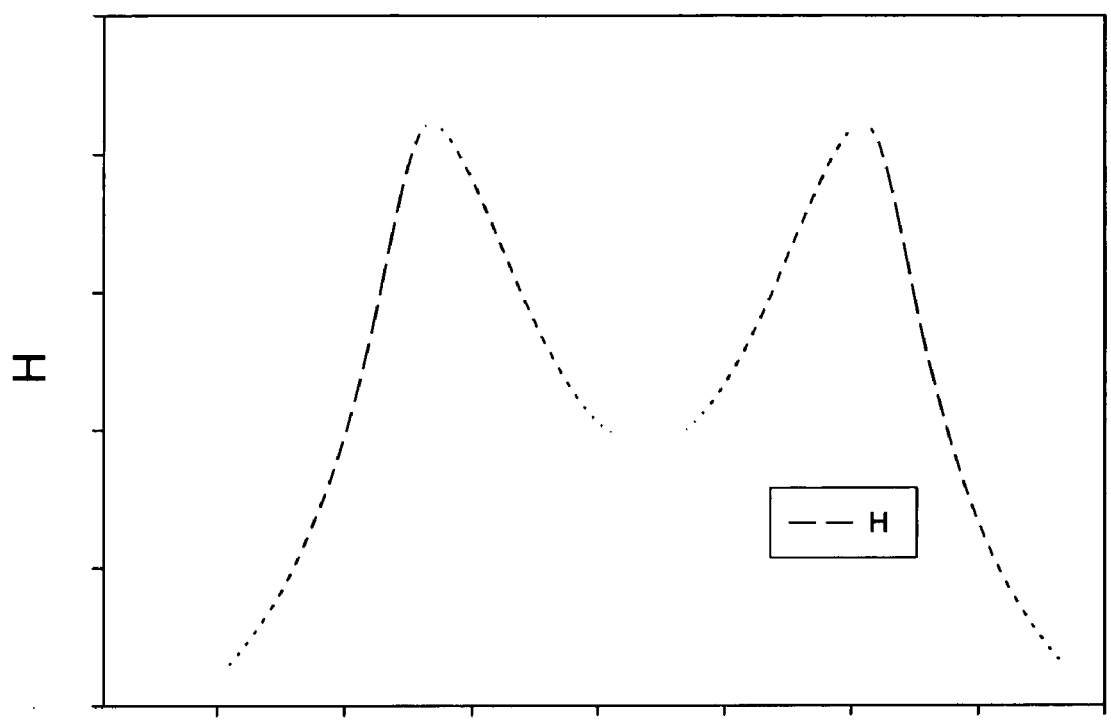

FIG. 24 illustrates the magnetic field resulting from two current carrying conductor of triangular cross-section.

Figure 25:
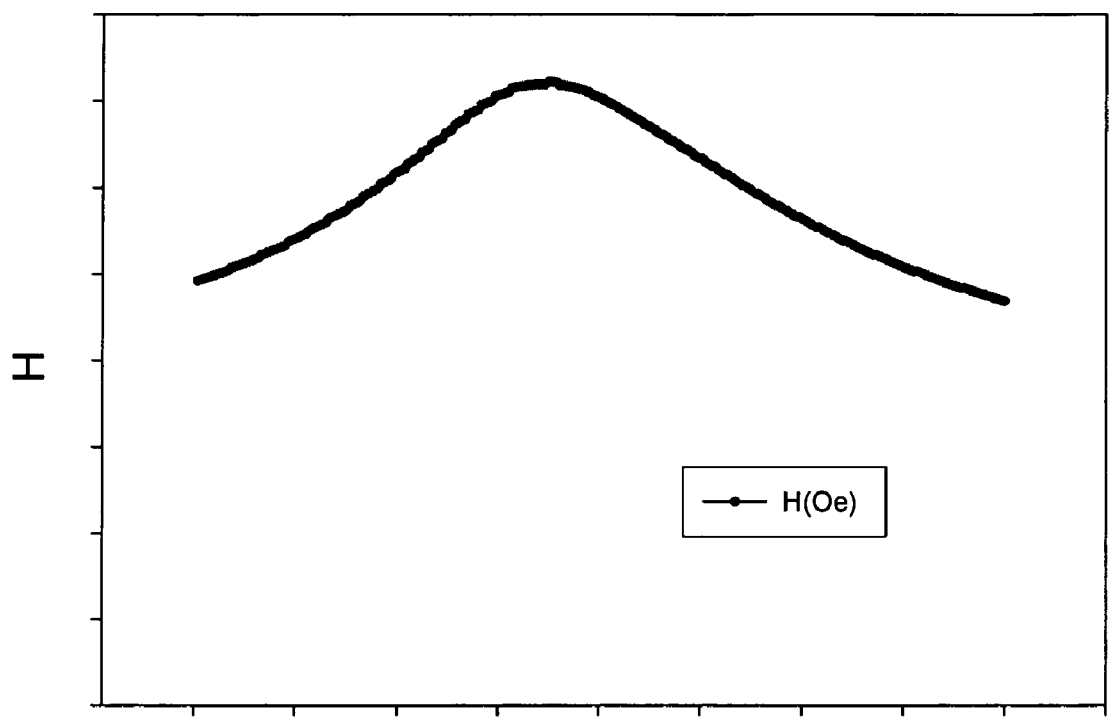

FIG. 25 illustrates the magnetic field generated by a conductor having a rectangular cross-section.

Figure 26:
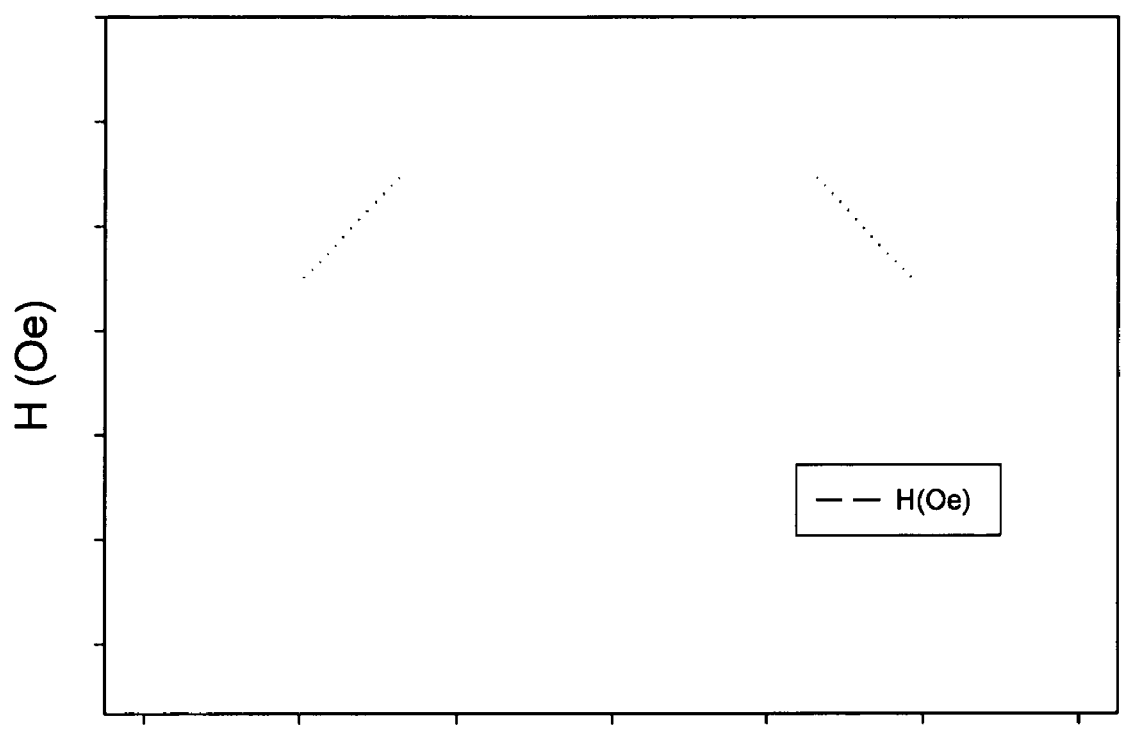

FIG. 26 illustrates the magnetic field generated by two conductors having a rectangular cross-section.

Figure 27:
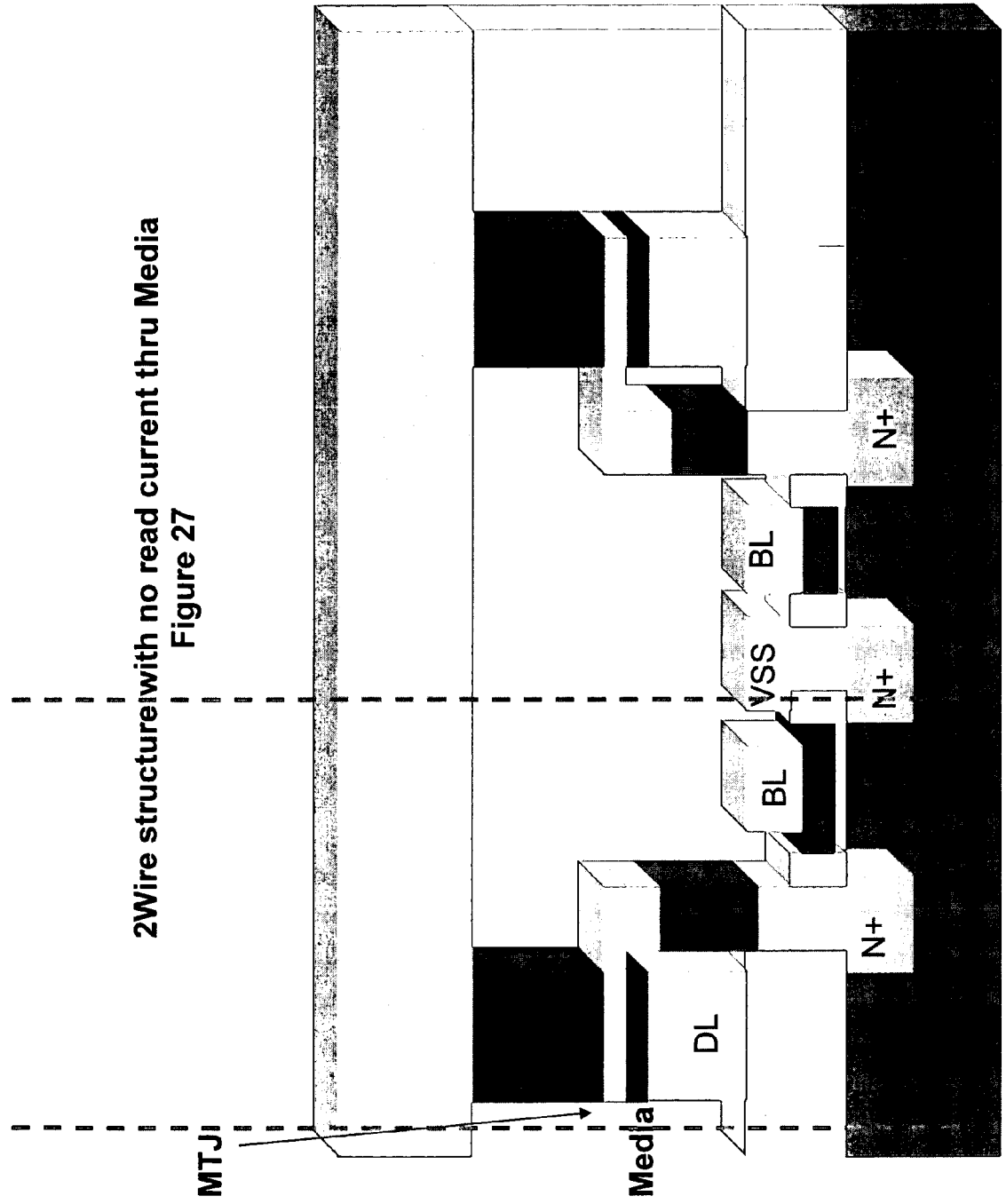

FIG. 27 illustrates an alternative embodiment of the design shown in FIG. 1, and more particularly illustrates a two wire embodiment of a magnetic memory cell in which no current passes through the media bit during a read operation.

Figure 28:
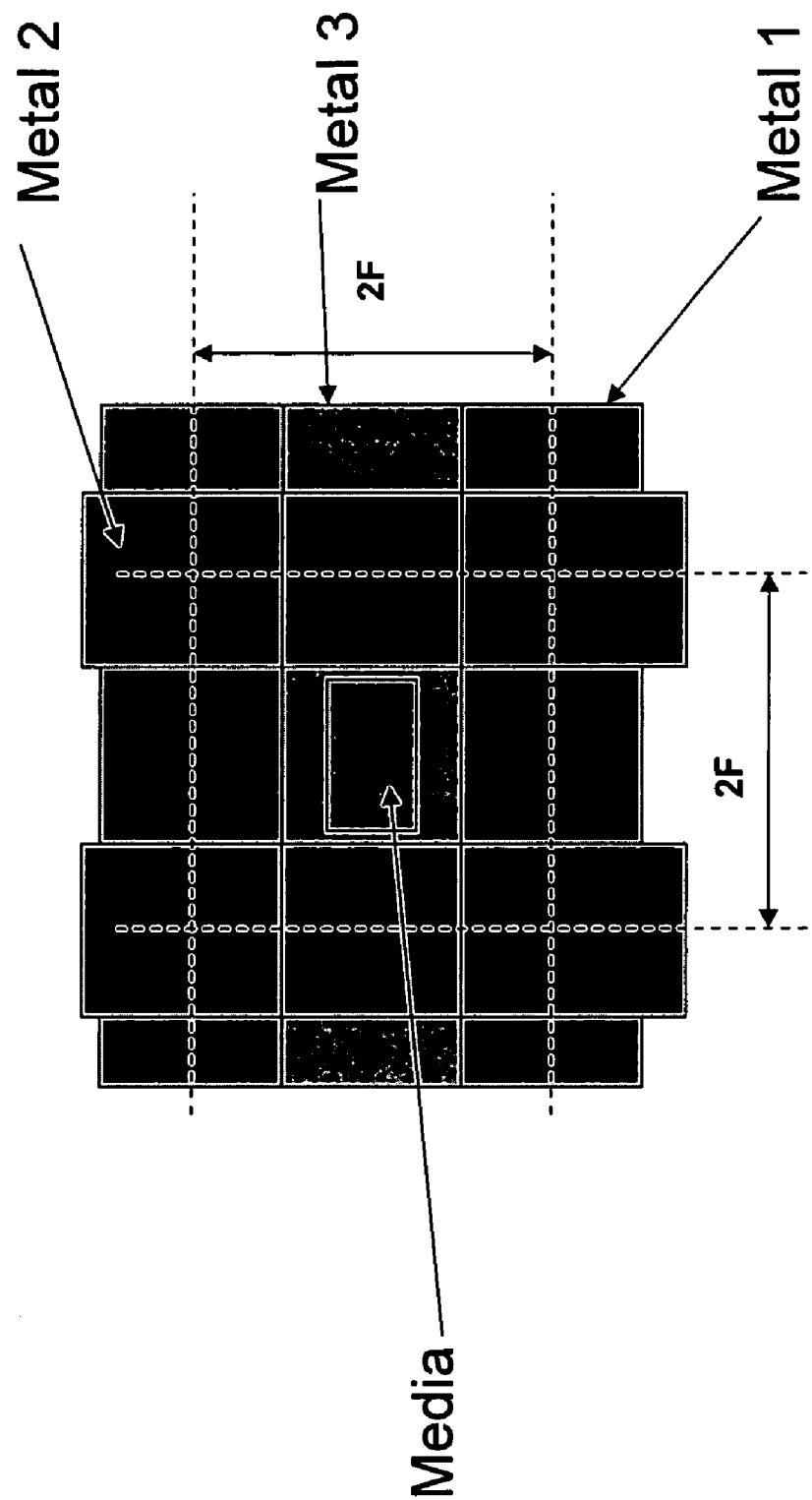

FIG. 28 illustrates a top view of a four wire cell in accordance with the invention.

FIG. 29 illustrates a cross-sectional view of a four wire cell in accordance with the invention.

Figure 30:
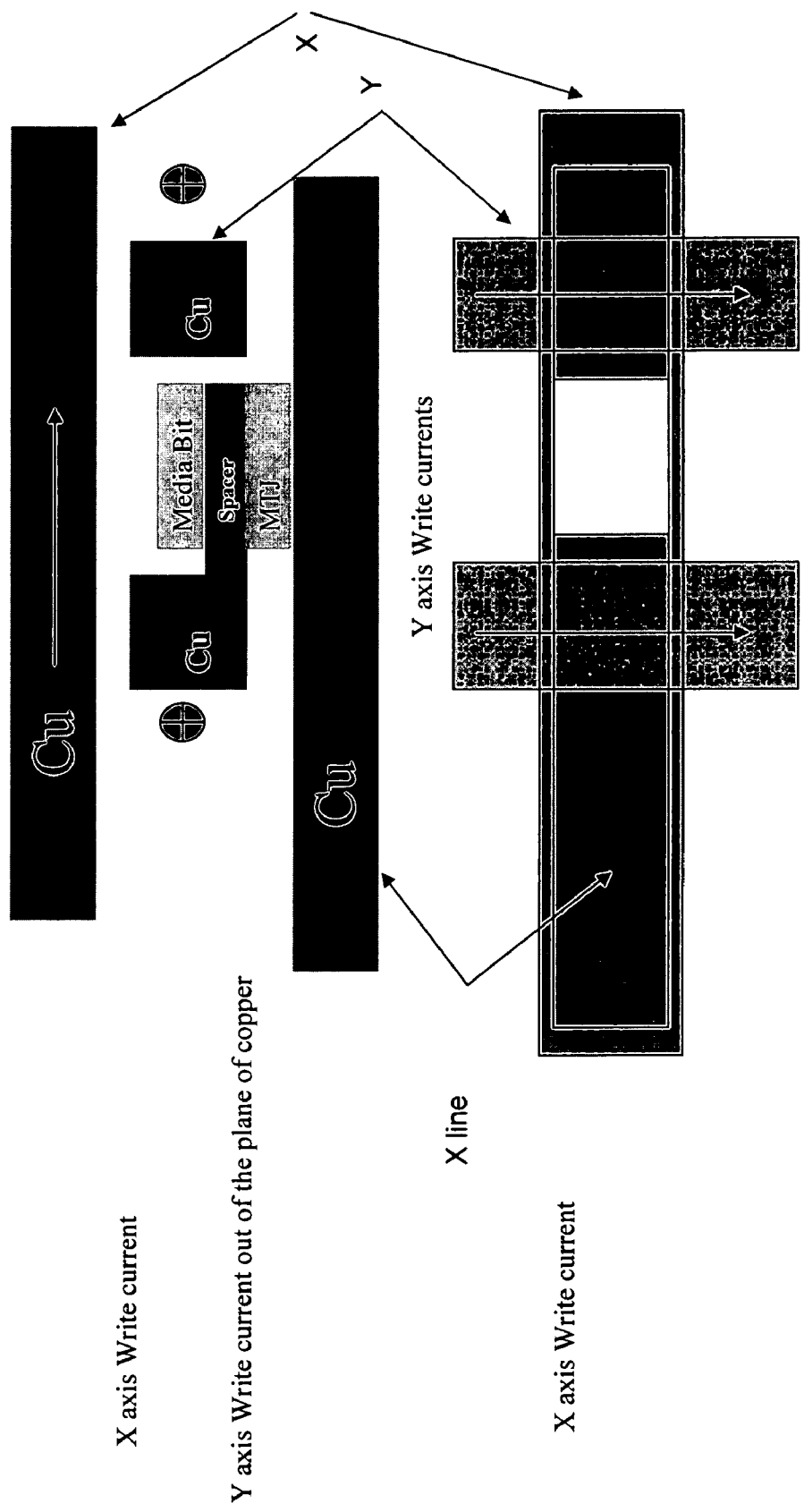

FIG. 30 illustrates cross-sectional and top plan views of a three wire cell and a write operation.

Figure 31:
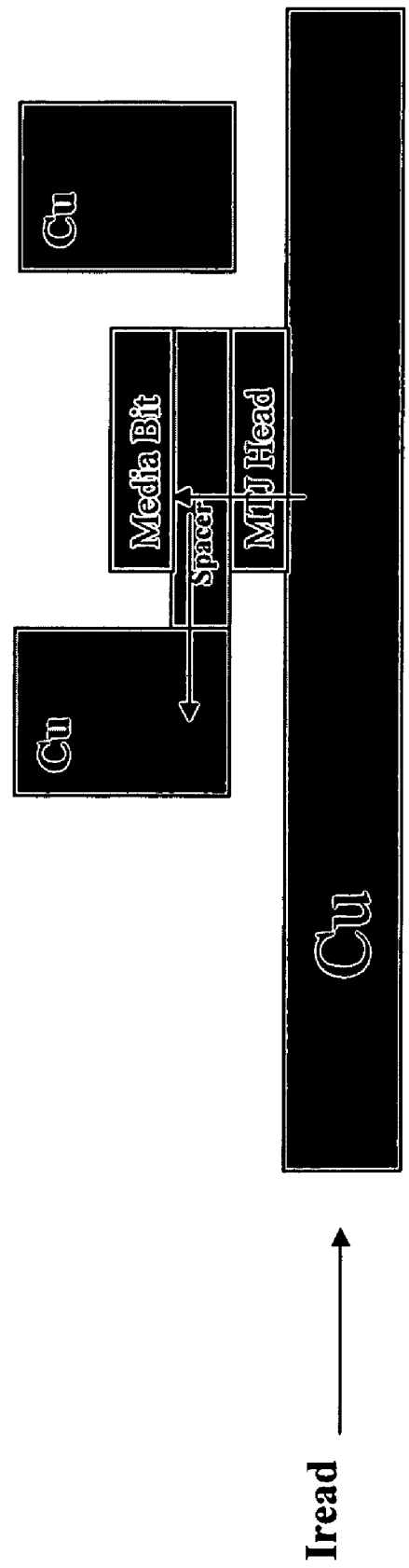

FIG. 31 illustrates in cross-sectional view the read operation of a three wire cell.

Figure 32:
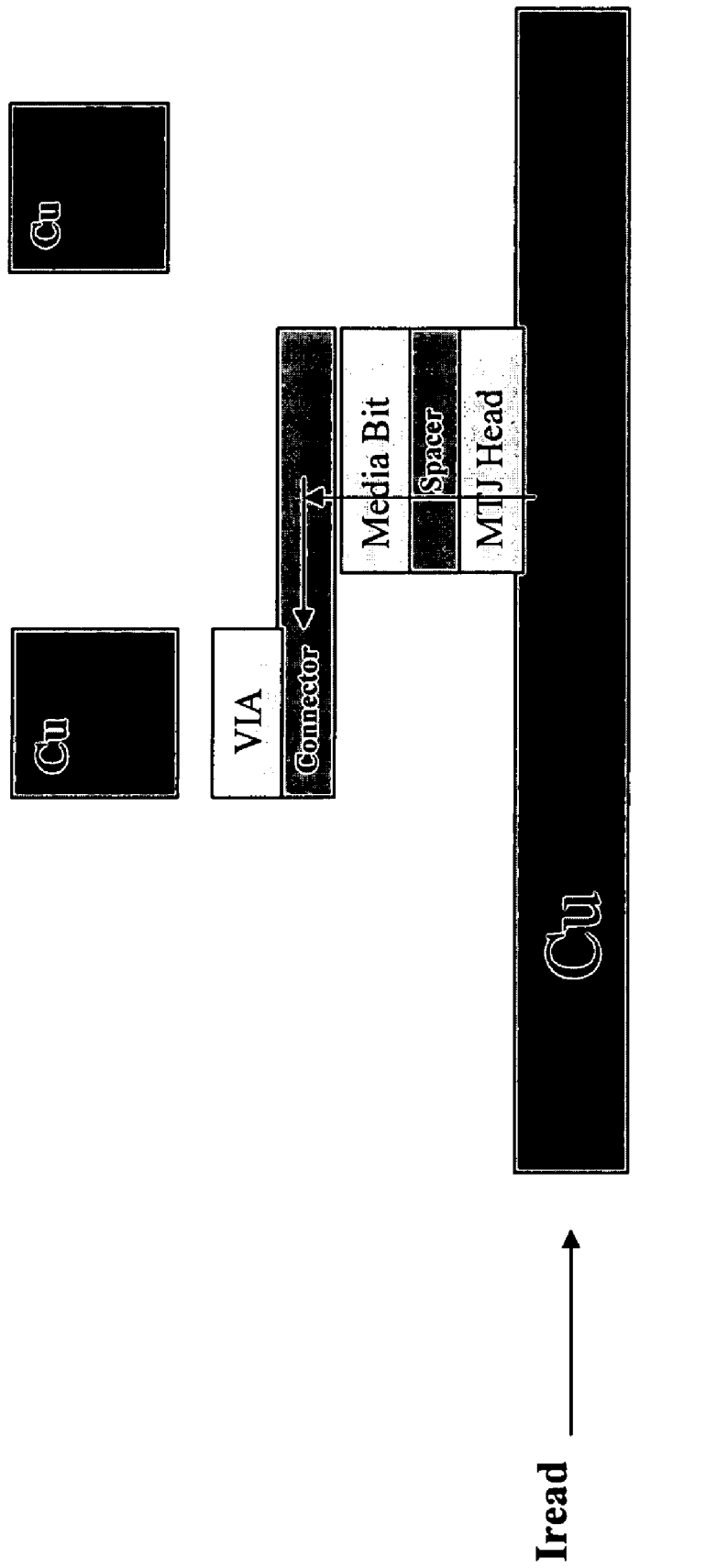

FIG. 32 illustrates in cross-sectional view a three wire cell.

Figure 33:
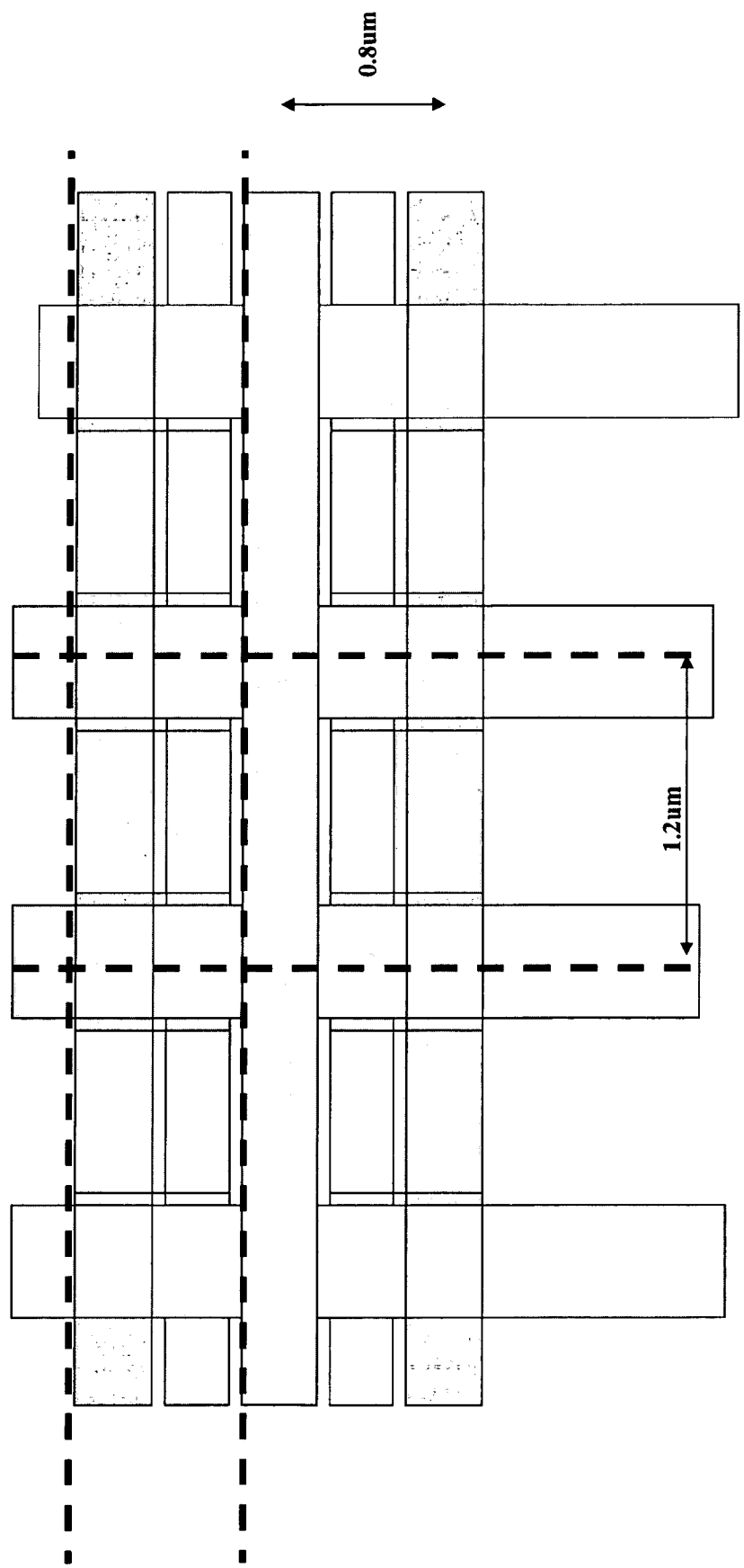

FIG. 33 illustrates an array of three wire cells in accordance with the invention.

DETAILED DESCRIPTION OF THE INVENTION

Referring first to FIG. 1, an embodiment of a memory cell 100 in accordance with the present invention is shown in cross-sectional view. A semiconductor substrate 103 has doped therein a pair of N+ channels 105. A gate 110, which serves as a bottom read line, is disposed above the substrate and spans substantially the space between the channels 105, creating a read access transistor 113. Positioned above the gate 110 is an X write line 115, and above the X write line 115 is a magnetic media bit 120. It will be appreciated by those skilled in the art that the X write line 115 extends substantially orthogonally into and out of the plane of the Figure. Proximate to and above the media bit 120 is a read lead 125, which is connected via conductors 130 to one of the N+ channels 105. Positioned on the opposite side of the read lead from the media bit is a magnetic sensor bit 135, above which are conductors which form the Y write line and the top read line 137. The sensor 135 includes a free layer. Ground line 140 connects to the remaining N+ channel 105, although the connection could also be to Vss in some embodiments. Dielectric 145 typically is positioned in the spaces between the other elements, as shown in FIG. 1. The media is made of either a single or multiple layers of ferromagnetic materials. The sensor can be any CPP/CIP sensor made of multiple layers of magnetic and non-magnetic layers which can sense the orientation of the media.

Referring next to FIG. 2, a write operation using the cell of FIG. 1 can be better appreciated. During a write operation, the read access transistor 113 is turned off, and a write current $WI_x$ is applied to the X line 115 in a direction going into the paper of FIG. 2. Concurrently, a write current $WI_y$ is applied to the Y write line 137 from right to left, as shown by the arrow, thus causing the magnetic media 120 and sensor 135 to conform to the fields generated by the write currents.

Referring next to FIG. 3, a read operation of the memory cell of FIG. 1 can be better appreciated. The read access transistor 113 is turned on, while the X write line 115 is left floating, with no voltage applied. A read current 300 is applied to top read line 137, such that read current flows in the direction shown by the arrows through the line 137, sensor 135, read lead 125, and then through conductors 130 to N+ channel 105. It will thus be appreciated that no current flows through the media 120 during a read operation. Because the sensor is magnetically coupled to the media, the state of the sensor is stable during a read while at the same time permitting the state of the cell to be read without passing a read current through the media 120.

The isolation of the media 120 during a read operation is represented in simplified form in FIG. 4, where the read current 300 can be seen to flow through the sensor 135, into the read lead 125, and then out through the read access transistor 113. Again, it can be seen that no current whatsoever passes through the media bit 120 during a read operation, thus avoiding many of the problems associated with prior art MRAM devices. In addition, the separation of the media from the sensor permits the magnetic properties of each to be optimized separately, while also providing greatly enhanced defect tolerance, as can be appreciated from FIG. 5, where the horizontal arrows show the direction of magnetization in each layer. While a horizontal orientation is shown, it will be appreciated that the present invention can also be applied to vertical recording, and a horizontal magnetization is shown only for the sake of clarity. In an embodiment, the magnetic strength of the media can be on the order of two times (or more) the magnetic strength of the sensor. A common problem with conventional MRAM devices is that a manufacturing defect in the free layer of the MRAM cell causes it not to switch with a given magnetic field. Thus the conventional MRAM cell is dead. However, in the present invention, the media 120 can be sufficiently greater strength than the free layer of the sensor 135, such that media will cause the free layer within the sensor to switch over a much wider tolerance than with conventional MRAM devices. Thus the cell of the present invention is read correctly and the cell is functional.

The non-intrusive read aspect of the present invention can be further appreciated from FIG. 6, which is a further simplified view of FIG. 4. The direction of magnetization of the ferromagnetic layers is shown by the horizontal arrows in those layers (but subject to change following a write operation), while the direction of current flow 300 during a read, for the embodiment shown, is shown by the vertical arrows through the sensor layers and the horizontal arrow through the read lead 125.

Referring next to FIGS. 7 through 14B, an additional benefit of the design of the present invention can be appreciated in comparison with convention MRAM devices. A conventional MRAM array 700 is shown in FIG. 7, and the effect of neighboring cells 705 on the state of a given cell 710 can be reasonably determined. By comparison, an array 800 of cells according to the present invention is shown in FIG. 8, and the effect of neighboring cells 805 on a given cell 810 can also be determined. For the examples shown, the material of the magnetic pieces is supermalloy, ms=$8*10^5$ and all of the cells are assumed to be switched in the same direction, as shown by the magnetization arrows. For comparison, the calculation of the magnetic field for the cell of the present invention was made in the upper surface of the cell, away from the plane z=0, as the magnetic field is zero in that plane.

The results of the determination for neighboring cells can be appreciated from FIGS. 9A (conventional MRAM) and 9B (present invention), with cells having the characteristics shown below FIG. 9A. The results of the comparison for closer neighboring cells can be appreciated from FIGS. 10A (conventional MRAM) and 10B (present invention). As can be seen, the effect of the magnetic field from neighboring cells is much greater on the conventional MRAM cell than on the cell of the present invention, thus providing cells of the present invention better stability at a given density, and also the ability to scale to greater densities than comparable MRAM cells.

When some cells are switched 90 degrees, the effect of neighboring cells changes, as can be best appreciated from FIGS. 11, 12A (MRAM) and 12B (present invention), where the cells again have the characteristics shown below FIG. 12A. For simplicity, FIG. 11 is used to represent the switched array for both conventional MRAM and the present invention, although those skilled in the art will recognize that the structure of the array of the present invention is indicated more precisely by FIG. 8. The intercell distance remains constant. The effect of neighboring cells when some of the cells are switched 180 degrees can similarly be appreciated from FIG. 13 (again representing both MRAM and the present invention, for simplicity, with a constant intercell distance), with the comparison of the resulting fields shown in FIGS. 14A (MRAM) and 14B (present invention). It will be appreciated that, in the switched configurations, the magnetic field of neighboring cells are the highest for MRAM devices, while the field remains low for the anti-ferromagnetic cells of the present invention.

Referring next to FIG. 15, an alternative embodiment of the invention is shown in which the read lead mask is eliminated, thus reducing process complexity. The embodiment of FIG. 15 maintains the separation of the media from the sensor, but permits read current to pass through the media, as shown by the repositioning of the read lead 125 in FIG. 15 being positioned directly below the media 120, unlike the arrangement shown in FIG. 1. The embodiment of FIG. 15 otherwise operates the same as the cell of FIG. 1, and thus the embodiment of FIG. 15 offers improved defect tolerance and lessens the influence on and from neighboring cells, thus permitting greater cell density and better scalability. For the sake of simplicity, FIG. 15 uses the same reference numerals as FIG. 1 for similar elements.

Referring next to FIG. 16, the construction of an embodiment of a memory cell such as described above is shown in greater detail. While the cell shown in FIG. 16 has the same arrangement as for FIG. 15, only the position of and connection to the read lead 125 is changed in the embodiment of FIG. 1. The device can be manufactured as a regular array of memory cells which are randomly accessible. The magnetic memory array can be integrated between metal 2 and metal3 or metal3 and metal4 or any metal above metal2 in any standard CMOS semiconductor process. Note that, in at least some embodiments, the anneal step is performed before fabricating the copper layer, to minimize copper diffusion.

A cross-sectional view of the device of FIG. 16 can be appreciated from FIG. 17, although it will be appreciated that the particular dimensions and materials shown are exemplary and not limiting. It will also be appreciated from FIG. 17 that a ferrous nickel layer can be included in some embodiments of the structure, to provide magnetic shielding. As with FIG. 16, the cell shown in FIG. 17 reflects the embodiment of FIG. 15, but only the position of and connection to the read lead 125 changes between the embodiments of FIGS. 1 and 15.

Referring next to FIGS. 18A-18D, 19A-19G and 20A-20C, a process for fabricating the memory cell of the present invention can be better understood. A conventional CMOS process is used to fabricate a silicon CMOS wafer up through metal2, after which oxide is deposited and then trenched according to Mask 1. A seed layer deposition follows, after which copper electroplating is performed, followed by CMP as shown in FIG. 19B. A maglayer stack is formed as shown in FIG. 19C, followed by an ion mill, and an $Al_2O_3$ deposition by PVD as shown in FIG. 19D. An etch with mask 3 is performed, followed by M2 deposition, M2 etch, and RIE with mask 4, as shown up through FIG. 19G. A further $Al_2O_3$ deposition is performed as shown in FIG. 20A, followed by pad definition and pad formation in FIGS. 20B and 20C.

Reference is next made to FIG. 21, which shows an image of a 1 Mb random access memory in accordance with the present invention.

From the foregoing description, it will also be appreciated that the memory structure described above is fabricated on top of the drive circuitry, which has already been fabricated on a substrate. This reduces chip size for the memory device significantly as the semiconductor circuitry lies beneath the magnetic memory array. The process can be appreciated in detail from FIGS. 18A-20C, but in general can be seen to comprise the steps of (1) fabricating the drive circuitry, followed by (2) fabricating interconnect metals and vias, (3) fabricating the magnetic memory, and finally, (4) fabricating pads and any other interconnects to connect to the interconnects and vias of step (2). Those skilled in the art will appreciate that the first two steps can be performed using conventional CMOS or other semiconductor processing steps, and the third and fourth steps can be performed as post-processing steps. In this manner the underlying semiconductor circuitry and the magnetic memory array are integrated. It will be appreciated that, while the steps shown are for a magnetic memory, in general the method could be applied to any device which does not require a single crystalline semiconductor substrate. In some embodiments, the addition of magnetic shielding may be performed after the fourth processing step. Because one or more of the magnetic materials and/or processing steps can be incompatible with CMOS and other semiconductor processing, careful control of the thermal budget throughout the process is preferably utilized.

Referring next to FIGS. 22-26, an entirely different aspect of the aspect of the present invention can be appreciated. In particular, it has been discovered that, by carefully shaping the X and Y write lines, which typically occur in pairs in the memory cells discussed hereinabove, the current required to create a magnetic field sufficient to switch the magnetization of the media 120 is decreased relative to what would be required for a conventional conductor. In particular, if a single conductor having a triangular cross-section as shown in FIG. 22 is used, a magnetic field as shown in FIG. 23 is generated. Similarly, if two conductors having triangular cross-sections as shown in FIG. 22 are used, then the magnetic field of FIG. 24 results. By comparison, the magnetic field generated by a single conductor of rectangular cross-section is shown in FIG. 25, and the field generated by two conductors of rectangular cross-section is shown in FIG. 26. It will be further appreciated that the rhomboidal shapes shown in FIG. 22 will also yield benefits in at least some embodiments.

Referring next to FIG. 27, a still further embodiment of the present invention. In the embodiment of FIG. 27, a cell having two write wires is shown in which no read current is passed through the media. It will be appreciated that FIG. 27 illustrates two adjacent cells which essentially are formed as mirror images.

Referring next to FIG. 28, a top plan view of a four wire memory cell such illustrates the X and Y pairs of write wires and their positioning around the media bit 120. It will be appreciated that the media bit need not be rectangular as shown in FIG. 28, and the X and Y write lines need not be straight. Alternatively, in some embodiments the media bit can be ovoid or other shapes and the lines can follow the same basic shape as the media bit.

Referring next to FIG. 29 a cross-section of the cell of FIG. 28 can be better appreciated. In particular, as shown by the read lead, it can be seen that no read current passes through the media bit in this embodiment.

Referring next to FIGS. 30 and 31, writing to and reading from a three-wire cell in accordance with the invention can be better appreciated. As shown by the arrangement of the media bit in FIG. 30, the X and Y write lines can be better appreciated, where current flows in the direction of the black arrows. FIG. 31 shows a read operation from a three wire cell, and again with the current flowing in the directions shown by the black arrows.

FIG. 32 shows a simplified memory cell, similar to FIG. 15, and particularly illustrates the flow of current fpr a cell in which the read lead cause current to pass through the media bit.

FIG. 33 shows an array of memory cells in accordance with the designs shown in FIGS. 1 and 15.

Having fully described an embodiment of the invention and various alternatives, those skilled in the art will recognize, given the teachings herein, that numerous alternatives and equivalents exist which do not depart from the invention. It is therefore intended that the invention not be limited by the foregoing description.

I claim:

1. A solid state magnetic memory cell comprising
a magnetic media;
a magnetic sensor magnetically coupled to the media to read data stored in the magnetic media;
a metal spacer positioned between the sensor and the media, wherein the metal spacer is in contact with the sensor and the media; and
at least two write lines;
wherein during a read operation a read current flows through the magnetic sensor and exits through the metal spacer, bypassing the magnetic media entirely.

2. The solid state magnetic memory cell of claim 1, wherein the magnetic sensor comprises a Giant Magnetoresistive (GMR) stack.

* * * * *

UNITED STATES PATENT AND TRADEMARK OFFICE
CERTIFICATE OF CORRECTION

PATENT NO. : 7,649,765 B2
APPLICATION NO. : 11/964359
DATED : January 19, 2010
INVENTOR(S) : Krishnakumar Mani It is certified that error appears in the above-identified patent and that said Letters Patent is hereby corrected as shown below:

Title page,
Item [63], delete the Related U.S. Application Data, and substitute the following:

--Continuation-in-part of application No. 10/985,472, filed on Nov. 10, 2004, and a continuation-in-part of application No. 11/701,322, filed on Jan. 31, 2007.--

In the Specifications:

Column 1,
Lines 6-22, delete the entire paragraph and substitute the following:

--This application claims the benefit of U.S. Provisional Patent Application Ser. No. 60/876,639, filed Dec. 22, 2006, and further is a continuation-in-part of U.S. Patent Application Ser. No. 10/985,472, filed Nov. 10, 2004, and is also a continuation-in-part of U.S. Patent Application Ser. No. 11/701,322, filed on Jan. 31, 2007, all of which are incorporated herein by reference.--

Signed and Sealed this
Twenty-fifth Day of June, 2013

Teresa Stanek Rea
*Acting Director of the United States Patent and Trademark Office*